United States Patent [19]

Clark

[11] Patent Number: 4,906,879
[45] Date of Patent: Mar. 6, 1990

[54] TERBIUM-DYSPROSIUM MAGNETOSTRICTIVE HIGH POWER TRANSDUCERS

[75] Inventor: Arthur E. Clark, Adelphi, Md.

[73] Assignee: The United States of America as represented by the Secretary of the Navy, Washington, D.C.

[21] Appl. No.: 374,119

[22] Filed: Jun. 30, 1989

[51] Int. Cl.[4] .................... H04B 11/00; H01L 41/20
[52] U.S. Cl. ..................................... 310/26; 148/300; 420/416
[58] Field of Search .................. 148/103, 300; 310/26; 335/215; 420/416

[56] References Cited

U.S. PATENT DOCUMENTS

| 3,949,351 | 4/1976 | Clark et al. | 420/416 |
| 4,158,368 | 6/1979 | Clark | 310/26 |
| 4,308,474 | 12/1981 | Savage et al. | 310/26 |
| 4,375,372 | 3/1983 | Koon et al. | 420/416 |
| 4,845,450 | 7/1989 | Porzio et al. | 310/26 |

Primary Examiner—Patrick R. Salce
Assistant Examiner—D. L. Rebsch
Attorney, Agent, or Firm—Kenneth E. Walden; Roger D. Johnson

[57] ABSTRACT

Magnetic energy is converted into mechanical energy by applying a changing magnetic field to a rare earth alloy of the formula $Tb_xDy_{1-x}$ at a temperature in the range of about 0° K. to 170° K., wherein x and the operating temperature are selected to minimize the basal plane anisotropy.

9 Claims, 2 Drawing Sheets

TERBIUM-DYSPROSIUM MAGNETOSTRICTIVE HIGH POWER TRANSDUCERS

BACKGROUND OF THE INVENTION

This invention relates to transducers and more particularly to magnetostrictive transducers.

For high power transduction, one needs a large magnetostriction, i.e., fractional change in length with magnetic field. The maximum mechanical power that can be generated is proportional to the maximum energy density per cycle ($\frac{1}{2}Y\lambda^2$, where Y is the Young's modulus and $\lambda$ is the maximum magnetostriction). Since the $\lambda$ is derived from a rotation of the magnetization, it is desirable to utilize a material with a low magnetic anisotropy (K) such that rotation can be accomplished with a relatively low applied magnetic field. Thus it is important that the ratio of $\lambda^2/K$ be high.

The rare earth elements are noted for their large magnetostrictive values. However, they are also noted for their high magnetic anisotropies, which make magnetization rotation difficult with low applied magnetic fields. As a result, the efficiency of transducers using rare earth elements is limited.

SUMMARY OF THE INVENTION

Accordingly, an object of this invention is to provide a new method of converting magnetic energy into mechanical energy.

Another object of this invention is to provide a new method of producing high power magnetostrictive transduction at low temperatures.

A further object of this invention is to provide a more efficient method of converting magnetic energy into mechanical energy.

These and other objects of this invention are accomplished by providing a method of converting magnetic energy into mechanical energy in the form of a change of dimension in a material by subjecting a hexagonal crystal of a material of the formula $Tb_xDy_{1-x}$ at a temperature T to a change in magnetic field wherein x and T are the coordinates of a point within the polygon ABCDEFGH in FIG. 3 wherein the coordinates of the vertices of the polygon are as follows:

| Vertices | Coordinates | |
|---|---|---|
|  | x | T(°K.) |
| A | 0.90 | 0 |
| B | 0.70 | 90 |
| C | 0.40 | 150 |
| D | 0.10 | 170 |
| E | 0.10 | 110 |
| F | 0.40 | 90 |
| G | 0.70 | 40 |
| H | 0.70 | 0 |

DETAILED DESCRIPTION OF THE PREFERRED EMBODIMENT

In this invention a magnetostrictive element composed of an alloy of the rare earth metal terbium (Tb) and the rare earth metal dysprosium (Dy) is used to convert magnetic energy in the form of a change in magnetic field into mechanical energy in the form of a change in dimension in the magnetostrictive element. This process achieves a high $\lambda^2/K$ value where $\lambda$ is the magnetostriction and K is the magnetic anisotropy. It was known that both Tb and Dy have large magnetostrictions individually. Both Tb and Dy have a hexagonal crystal structure and the basal plane is easy magnetically (i.e., the magnetization prefers to lie in the plane). However, in this plane there is still sufficient magnetic anisotropy to make magnetization rotation difficult with low applied magnetic fields, particularly at low temperatures.

Figure 1:
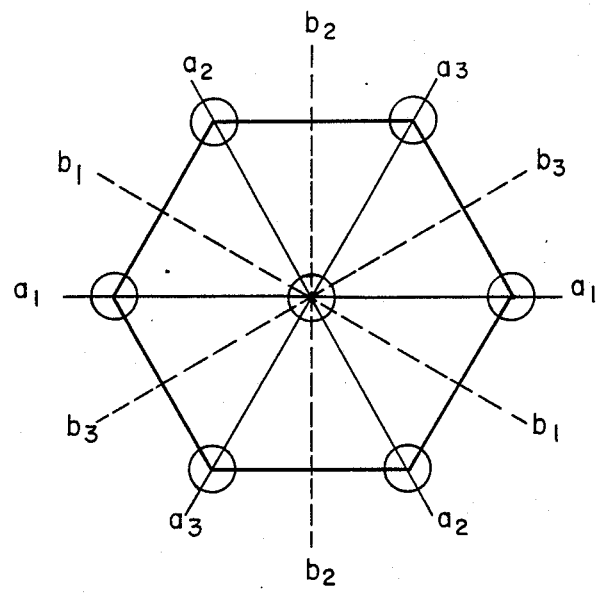
FIG. 1 illustrates the basal plane of a hexagonal crystal.

FIG. 1 shows the basal plane of a hexagonal crystal. The 3 equivalent lateral crystallographic axes $a_1$, $a_2$, and $a_3$ are collectively referred to as the a-axis. Bisecting the 60° C. angles between $a_1$, $a_2$, and $a_3$ are a second set of 3 equivalent axes $b_1$, $b_2$, and $b_3$ which are collectively referred to as the b-axis. Tb has a strong positive basal plane anisotropy ($K^6_6$) where the b-axis of the basal plane is easy magnetically. Dy has a strong negative basal plane anisotropy ($K^6_6$) where the a-axis is easy magnetically. Whether the basal plane anisotropy $K^6_6$ is strongly positive or strongly negative, magnetization rotation is difficult with low applied magnetic fields.

The alloy used in this invention is represented by the formula $Tb_xDy_{1-x}$ wherein x is the mole fraction of Tb and $1-x$ is the mole fraction of Dy, and $0 < x < 1$. The alloy will have hexagonal crystals. The object is to select a composition in which the a-axis and the b-axis are easy magnetically to nearly the same degree. The magnetic field can then align an a-axis or a b-axis with approximately the same degree of ease. In this case the positive basal plane anisotropy of the Tb cancels out the negative basal anisotropy of the Dy, producing a condition of near zero basal plane anisotropy ($K^6_6 \approx 0$).

Figure 2:
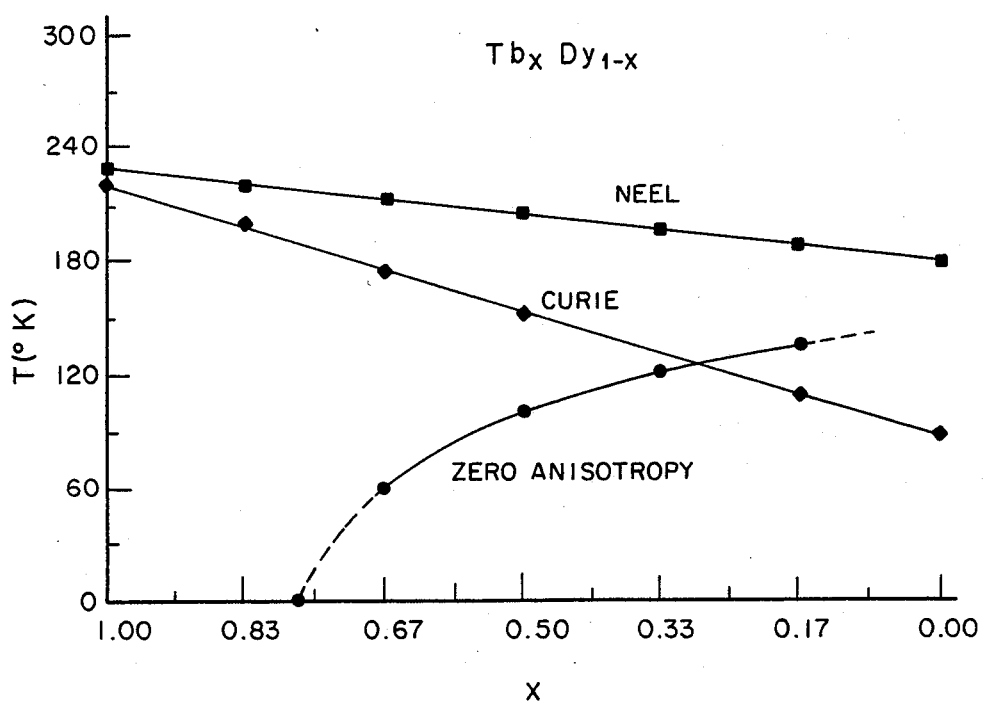
FIG. 2 is a graph of the Neel temperature ($T_n$), the Curie temperature ($T_c$), and the line of zero anisotropy of $Tb_xDy_{1-x}$ with the temperature (T) and x as coordinates.

Because the basal plane anisotropies of Tb and Dy vary with temperature at different rates, the composition of $Tb_xDy_{1-x}$ which produces zero basal plane anisotropy ($K^6_6 - O$) varies with the temperature. FIG. 2 shows the zero anisotropy line as a function of temperature and composition. (Also shown in FIG. 2 are the Neel temperature ($T_n$) and the Curie temperature ($T_c$) as functions of composition.) For the process of this invention the operative range is defined by a zone around the zero anisotropy line.

A second factor which limits the operative temperature range is the magnetostriction ($\lambda$) of the alloys. Both Tb and Dy have large positive basal plane magnetostrictions at low temperatures. As the temperature is increased the magnetostriction decreases for a given alloy. For temperatures of 120° K. or lower the basal plane magnetostriction for $Tb_xDy_{1-x}$ will be 0.5% or greater. For temperatures of 100° K. or less, the basal plane magnetostriction for $Tb_xDy_{1-x}$ alloys will be 0.6% or greater. A preferred lower limit would be ~0°K. with a more preferred lower limit being the temperature of liquid nitrogen (b.p. at 1 atmosphere about 77° K.).

Figure 3:
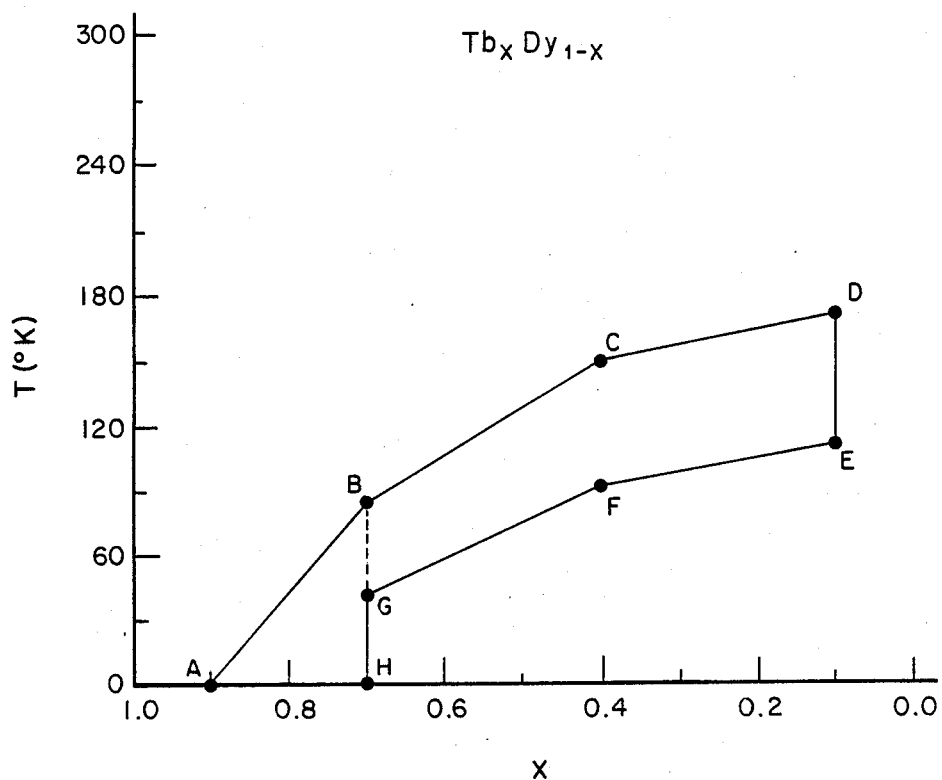
FIG. 3 is used to help illustrate the limits in the ranges of the alloy composition (x) and the operating temperature (T).

The operating range is defined as a function of temperature and composition of $Tb_xDy_{1-x}$. This range is defined as a polygon with vertices A, B, C, D, E, F, G, and H plotted against x and the temperature T (°K) as shown in FIG. 3. The values for the vertices are given in Table 1.

TABLE 1

| Vertices | x | T (°K.) |
|---|---|---|
| A | 0.90 | 0 |
| B | 0.70 | 90 |
| C | 0.40 | 150 |
| D | 0.10 | 170 |
| E | 0.10 | 110 |
| F | 0.40 | 90 |
| G | 0.70 | 40 |
| H | 0.70 | 0 |

A preferred range of operating conditions is contained in the polygon with vertices B, C, D, E, F, and G plotted against x and the temperature T (°K) as shown in FIG. 3. The values for the vertices are given in Table 2.

TABLE 2

| Vertices | x | T (°K.) |
|---|---|---|
| B | 0.70 | 90 |
| C | 0.40 | 150 |
| D | 0.10 | 170 |
| E | 0.10 | 110 |
| F | 0.40 | 90 |
| G | 0.70 | 40 |

The coordinates (x and T) of any point within the polygon ABCDEFGH define an operative combination of composition and temperature for this invention, with points within the polygon BCDEFG defining preferred combinations of composition and temperature.

Liquid nitrogen (b.p. ~77° K.) can be used to produce a temperature range of from 65° K. to 90° K. The lower temperatures (70° K.$\leq$T$\leq$77° K.) can be achieved by pumping the liquid nitrogen. The higher temperatures (77° K.$\leq$T$\leq$90° K.) can be achieved by supporting the $Tb_xDy_{1-x}$ alloy on a cold finger or similar device. In this temperature range of from 70° K. to 90° K., a preferred range for x is from 0.50 to 0.67.

The $Tb_xDy_{1-x}$ alloy of the transducer element may be in the form of a random polycrystal (isotropic), a grain-oriented polycrystal (textured), or, a single crystal. The grain-oriented polycrystal and single crystal are preferred because they are more efficient than a randomly oriented polycrystal. Similarly, the single crystal $Tb_xDy_{1-x}$ alloy material is most preferred because it is the most efficient in converting magnetic energy into mechanical energy.

The general nature of the invention having been set forth, the following examples are presented as specific illustrations thereof. It will be understood that the invention is not limited to these specific examples but is susceptible to various modifications that will be recognized by one of ordinary skill in the art.

EXAMPLES

Single crystal $Tb_xDy_{1-x}$ samples grown from 99.9 percent pure rare earths were obtained from B.J. Beaudry, Materials Preparation Center, Ames Laboratory, Iowa State University, Ames, Iowa 50011. The single crystal samples used were of the formulas $Tb_{0.17}Dy_{0.83}$, $Tb_{0.33}Dy_{0.67}$, $Tb_{0.50}Dy_{0.50}$, and 83, Tb 33Dy.67, Tb 50Dy 50, and $Tb_{0.67}Dy_{0.33}$. To determine the optimum values of x(T) such that $\lambda^2/K$ is large, magnetostriction measurements were made from T = 60° K. to room temperature as a function of magnetic field strength and angle between the magnetic field direction and the measurement direction. Measurements were taken along the a and b directions and the field was applied in the basal plane. At the high fields (20 kOe), the magnetizations of the samples were nearly parallel to the applied fields, resulting in conventional $1/\Delta l = \cos^2\theta$ curve where $\theta$ is the angle between the magnetic field direction and the measurement direction and $\Delta l/l$ is the fractional length change. At low fields (6 kOe), the magnetization was parallel to the magnetic field only in the cases where the magnetic anisotropy K is small. Referring to FIG. 2, the results for $Tb_{0.17}Dy_{0.83}(x=0.17)$, $Tb_{0.33}Dy_{0.67}(x=0.33)$, Tb 50Dy 50 (x = 0.50), and Tb 67Dy33 (x = 0.67) are plotted $Tb_{0.50}Dy_{0.50}(x=0.50)$, and $Tb_{0.67}Dy_{33}(x=0.67)$ are plotted along the zero anisotropy line.

Obviously, numerous modifications and variations of the present invention are possible in light of the above teachings. It is therefore to be understood that within the scope of the appended claims the invention may be practiced otherwise than as specifically described herein.

I claim:

1. A method of converting magnetic energy into mechanical energy wherein the mechanical energy is in the form of a change in dimension in material comprising subjecting an alloy of the formula $Tb_xDy_{1-x}$ at temperature T to a change in magnetic field wherein x the mole fraction of Tb and the temperature T are defined by the coordinates of a point located within a polygon ABCDEFGH wherein the coordinates of the vertices of the polygon are listed in the following table

| Vertices | Coordinates | |
|---|---|---|
| | x | T(°K.) |
| A | 0.90 | 0 |
| B | 0.70 | 90 |
| C | 0.40 | 150 |
| D | 0.10 | 170 |
| E | 0.10 | 110 |
| F | 0.40 | 90 |
| G | 0.70 | 40 |
| H | 0.70 | 0 | and wherein 1−x is the mole fraction of Dy.

2. The method of claim 1 wherein the the $Tb_xDy_{1-x}$ alloy is a grain-oriented polycrystal alloy.

3. The method of claim 1 wherein the $Tb_x-Dy_{1-x}$ alloy is a single crystal.

4. The method of claim 1 wherein x the mole fraction of Tb and the temperature T are defined by the coordinates of a point located within a polygon BCDEFG wherein the coordinates of the vertices of the polygon are listed in the following table

| Vertices | Coordinates | |
|---|---|---|
| | x | T(°K.) |
| B | 0.70 | 90 |
| C | 0.40 | 150 |
| D | 0.10 | 170 |
| E | 0.10 | 110 |
| F | 0.40 | 90 |
| G | 0.70 | 40 |

5. The method of claim 4 wherein the $Tb_xDy_{1-x}$ alloy is a grain-oriented polycrystal alloy.

6. The method of claim 4 wherein the $Tb_xDy_{1-x}$ alloy is a single crystal.

7. A method of converting magnetic energy into mechanical energy wherein the mechanical energy is in the form of a change in dimension in material comprising subjecting an alloy of the formula $Tb_xDy_{1-x}$ at a temperature of from 65° K. to 90° K. to a change in magnetic field wherein $0.50 < x < 0.67$.

8. The method of claim 7 wherein the $Tb_xDy_{1-x}$ alloy is a grain-oriented polycrystal alloy.

9. The method of claim 7 wherein the $Tb_xDy_{1-x}$ alloy is a single crystal.

* * * * *